(12) United States Patent
Natarajan et al.

(10) Patent No.: US 7,475,315 B1
(45) Date of Patent: Jan. 6, 2009

(54) CONFIGURABLE BUILT IN SELF TEST CIRCUITRY FOR TESTING MEMORY ARRAYS

(75) Inventors: Balaji Natarajan, Santa Clara, CA (US); Jayabrata Ghosh Dastidar, Santa Clara, CA (US); Muhammad Naziri Zakaria, Gelugor (MY)

(73) Assignee: Altera Corporation, San Jose, CA (US)

( * ) Notice: Subject to any disclaimer, the term of this patent is extended or adjusted under 35 U.S.C. 154(b) by 23 days.

(21) Appl. No.: 11/652,205

(22) Filed: Jan. 10, 2007

(51) Int. Cl.
*G01R 31/28* (2006.01)

(52) U.S. Cl. ............... 714/733; 714/718; 714/30; 714/42; 714/719; 714/720; 714/725; 714/726; 714/734; 714/736; 714/742; 326/37; 326/39; 326/41; 365/201; 716/16

(58) Field of Classification Search .......... None
See application file for complete search history.

(56) References Cited

U.S. PATENT DOCUMENTS

| | | | |
|---|---|---|---|
| 6,108,806 A * | 8/2000 | Abramovici et al. | 714/725 |
| 6,184,707 B1 | 2/2001 | Norman et al. | |
| 6,353,552 B2 * | 3/2002 | Sample et al. | 365/154 |
| 6,492,833 B1 * | 12/2002 | Asson et al. | 326/41 |
| 6,681,354 B2 * | 1/2004 | Gupta | 714/725 |
| 6,725,442 B1 * | 4/2004 | Cote et al. | 716/16 |
| 6,839,873 B1 * | 1/2005 | Moore | 714/725 |
| 6,861,870 B1 | 3/2005 | Cheng et al. | |
| 6,889,368 B1 | 5/2005 | Mark et al. | |
| 6,950,974 B1 | 9/2005 | Wohl et al. | |
| 6,957,371 B2 * | 10/2005 | Ricchetti et al. | 714/733 |
| 7,000,165 B1 * | 2/2006 | Asson et al. | 714/733 |
| 7,062,694 B2 * | 6/2006 | Caty et al. | 714/733 |
| 7,117,415 B2 | 10/2006 | Forlenza et al. | |
| 7,159,145 B2 | 1/2007 | Wang et al. | |
| 7,162,663 B2 | 1/2007 | Beer et al. | |
| 2005/0039098 A1 * | 2/2005 | Camarota | 714/733 |
| 2005/0204231 A1 * | 9/2005 | Mukherjee et al. | 714/733 |
| 2005/0210352 A1 * | 9/2005 | Ricchetti et al. | 714/733 |

* cited by examiner

*Primary Examiner*—John P Trimmings
(74) *Attorney, Agent, or Firm*—Treyz Law Group; G. Victor Treyz

(57) ABSTRACT

Integrated circuits such as programmable logic device integrated circuits are provided that have memory arrays. The memory arrays can be tested using configurable built in self test circuitry. The built in self test circuitry may have test control register circuitry and configurable state machine logic. The state machine logic may perform at-speed tests on a memory array and may provide test results to external equipment for analysis. A tester may be used to provide test control settings to the test control register circuitry. The test control settings may include march element settings for a march sequence. During testing, the configurable state machine logic may use the march element settings to generate march sequences. March sequences that have been generated in this way may be used in testing the memory array.

18 Claims, 12 Drawing Sheets

CONFIGURABLE BUILT IN SELF TEST CIRCUITRY FOR TESTING MEMORY ARRAYS

BACKGROUND

This invention relates to memory testing, and more particularly, to configurable built in self test circuitry for performing memory tests.

Memory is widely used in the integrated circuit industry. Memory arrays are formed as part of integrated circuits such as application specific integrated circuits, programmable logic device integrated circuits, digital signal processors, microprocessors, microcontrollers, and memory chips.

Integrated circuits are generally tested before being sold. Testing can reveal memory faults that arise during device manufacturing. For example, testing may reveal that a particular memory array cell is stuck at a logical one value or that it is impossible to read data from a particular memory array cell. Identifying errors such as these allows integrated circuits to be repaired or discarded as appropriate.

It is often desirable to perform memory tests at normal clock speeds. Such tests, which are sometimes referred to as at-speed memory tests, may reveal faults that would otherwise not appear and therefore help to ensure that memory on an integrated circuit has been thoroughly tested.

In order to adequately test a memory array on an integrated circuit, it is often desirable to design the integrated circuit so that it incorporates internal testing circuitry. Such testing circuitry, which is sometimes referred to as built in self test circuitry can be used to perform at-speed tests on the memory array. If the tests indicate that a fault is present, the integrated circuit that contains the fault may be repaired or discarded.

In a typical configuration, a hardwired built in self test circuit is included on an integrated circuit. During testing, the hardwired built in self test circuit applies test vectors to the memory array to determine whether the memory array contains faults. If desired, a so-called soft built in self test circuit can be implemented from programmable logic resources on a programmable logic device integrated circuit.

Although hardwired and soft built in self test circuitry allows memory arrays to be tested at speed, the built in self test circuitry can consume a relatively large amount of circuit resources. This is particularly true when the built in self test circuitry is designed to run a number of different tests. For example, a built in self test circuit that has been designed to run five different memory tests might require roughly five times as much circuit real estate as a built in self test circuit that has been designed to run a single memory test.

It would therefore be desirable to be able to produce built in self test circuitry that can be configured to perform different memory tests without consuming significant amounts of circuit resources.

SUMMARY

In accordance with the present invention integrated circuits such as programmable logic device integrated circuits are provided that include memory arrays. The memory arrays may be tested using built in self test circuitry on the integrated circuits.

The built in self test circuitry may be formed from hardwired circuit resources or may be implemented by configuring some of the programmable logic resources on a programmable integrated circuit to serve as built in self test circuitry.

The built in self test circuitry may include test control register circuitry and configurable state machine logic. A tester may load test control settings into the test control register circuitry. The test control settings may be march element settings for a march sequence such as a march LR sequence. During testing, the configurable state machine logic receives the march element settings from the test control register circuitry. Based on the march element settings, the state machine logic performs march sequence tests on the memory array.

Further features of the invention, its nature and various advantages will be more apparent from the accompanying drawings and the following detailed description of the preferred embodiments.

BRIEF DESCRIPTION OF THE DRAWINGS

FIGS. 5-10 are diagrams of illustrative memory array background patterns that may be used when performing memory array tests with a configurable built in self test circuitry in accordance with an embodiment of the present invention.

DETAILED DESCRIPTION

The present invention relates to using configurable built in self test circuitry to test memory arrays. Memory arrays, which are sometimes referred to as memory blocks or memory regions, contain rows and columns of memory cells. The memory cells may, in general by any suitable nonvolatile or volatile memory cells. In a typical scenario, the memory cells are volatile random-access memory cells.

The memory arrays that are tested may be part of any suitable integrated circuits, such as application specific integrated circuits (e.g., video application specific integrated circuits), electrically programmable and mask-programmable programmable logic device integrated circuits, digital signal processors, microprocessors, microcontrollers, and memory chips. If desired, the testing circuitry of the present invention may be used in programmable integrated circuits that are not traditionally referred to as programmable logic devices such as microprocessors containing programmable logic, digital signal processors containing programmable logic, custom integrated circuits containing regions of programmable logic, or other programmable integrated circuits that contain programmable logic and one or more memory blocks.

The present invention is sometimes described herein in connection with the testing of memory arrays on programmable logic device integrated circuits. This is, however, merely illustrative. Configurable built in self test circuitry in accordance with the invention may be used to test a memory array on any suitable integrated circuit if desired.

Figure 1:
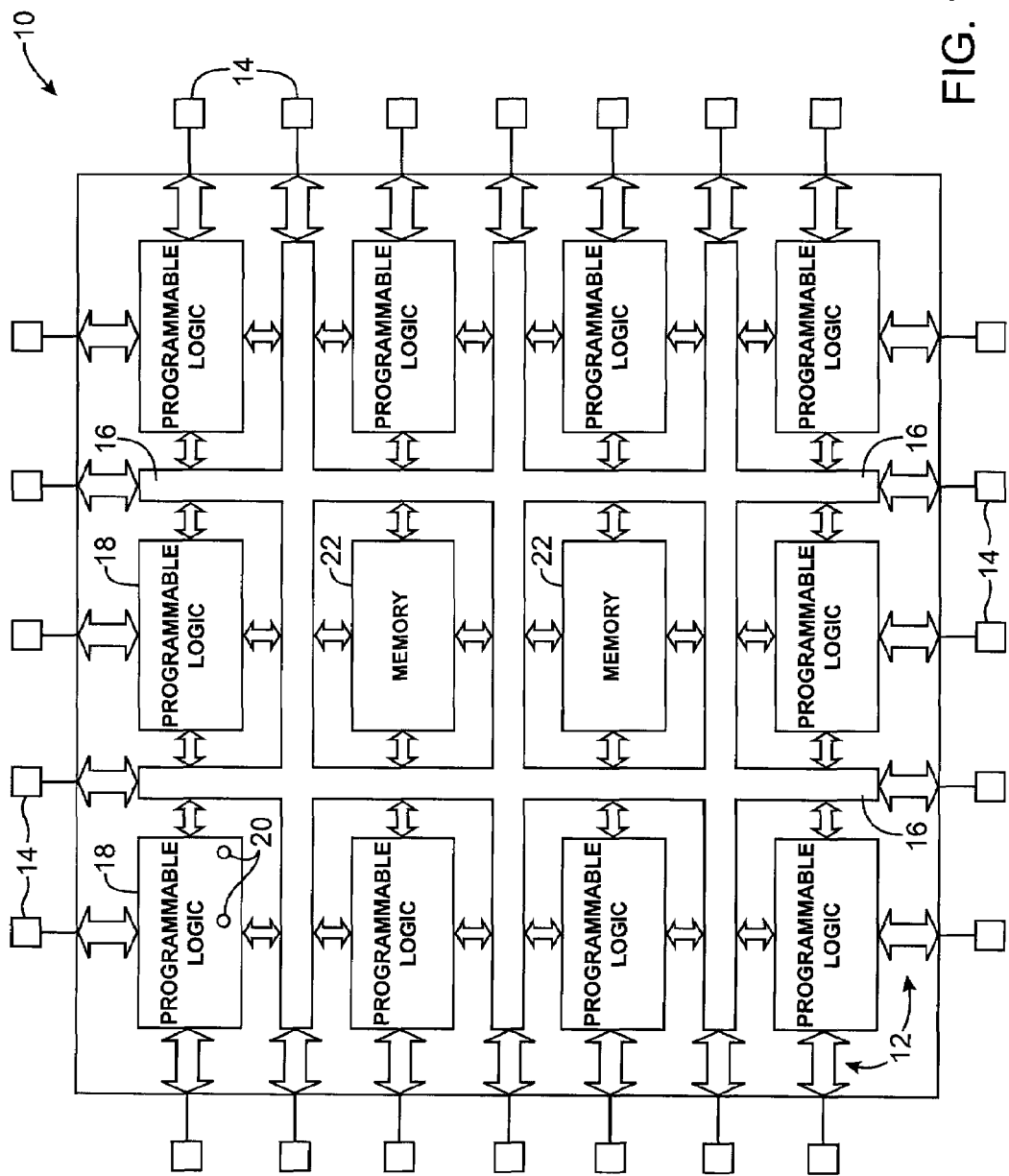
FIG. 1 is a diagram of an illustrative programmable logic device integrated circuit in accordance with an embodiment of the present invention.

An illustrative programmable logic device 10 in accordance with the present invention is shown in FIG. 1.

Programmable logic device 10 has input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include conductive lines and programmable connections between respective conductive lines and are therefore sometimes referred to as programmable interconnects 16.

Programmable logic device 10 contains programmable logic 18 and memory blocks 22.

Programmable logic 18 may include combinational and sequential logic circuitry. The programmable logic 18 may be configured to perform a custom logic function. The programmable interconnects 16 may be considered to be a type of programmable logic 18.

Programmable logic device 10 contains programmable memory elements 20. Memory elements 20 can be loaded with configuration data (also called programming data) using pins 14 and input/output circuitry 12. Once loaded, the memory elements each provide a corresponding static control output signal that controls the state of an associated logic component in programmable logic 18. Memory elements 20 may use any suitable volatile and/or non-volatile memory structures such as random-access-memory (RAM) cells, fuses, antifuses, programmable read-only-memory memory cells, mask-programmed and laser-programmed structures, etc. Because memory elements 20 are loaded with configuration data during programming, memory elements 20 are sometimes referred to as configuration memory or configuration RAM. Mask-programmed programmable logic devices, which are sometimes referred to as structured application specific integrated circuits, are programmed by using lithographic masks to create a custom pattern of connections in an array of vias based on configuration data.

Memory arrays 22 contain rows and columns of volatile memory elements such as random-access-memory (RAM) cells. The memory arrays 22 are used to store data signals during normal operation of device 10. The memory arrays 22 need not all be the same size. For example, small, medium, and large memory arrays 22 may be included on the same programmable logic device. There may, for example, be hundreds of small memory arrays each having a capacity of about 512 bits, 2-9 large memory arrays each having a capacity of about half of a megabit, and an intermediate number of medium size memory arrays each having a capacity of about 4 kilobits. These are merely illustrative memory array sizes and quantities. In general, there may be any suitable size and number of memory arrays 22 on device 10. There may also be any suitable number of regions of programmable logic 18.

During normal use in a system, memory elements 20 are generally loaded with configuration data from a configuration device integrated circuit via pins 14 and input/output circuitry 12. The outputs of the loaded memory elements 20 are applied to the gates of metal-oxide-semiconductor transistors in programmable logic 18 to turn certain transistors on or off and thereby configure the logic in programmable logic 18. Programmable logic circuit elements that may be controlled in this way include pass transistors, parts of multiplexers (e.g., multiplexers used for forming routing paths in programmable interconnects 16), look-up tables, logic arrays, AND, OR, NAND, and NOR logic gates, etc.

During testing, configuration data is generally loaded into memory elements 20 from a tester.

The circuitry of device 10 may be organized using any suitable architecture. As an example, the logic of programmable logic device 10 may be organized in a series of rows and columns of larger programmable logic regions each of which contains multiple smaller logic regions. The resources of device 10 such as programmable logic 18 and memory 22 may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, the device 10 generally also includes some programmable logic associated with the programmable interconnects, memory, and input-output circuitry on device 10. For example, input-output circuitry 12 may contain programmable input and output buffers. Interconnects 16 may be programmed to route signals to a desired destination.

In accordance with the present invention, programmable logic device 10 may include configurable built in self test circuitry for testing memory arrays such as memory arrays 22 of FIG. 1. The built in self test circuitry may perform at-speed tests to determined whether the memory arrays are operating properly. If an error is detected, the programmable logic device can be repaired by switching redundant circuitry into use (if available) or the programmable logic device can be discarded.

The ability to perform detailed tests on circuitry such as programmable logic device memory array circuitry can be particularly critical during the early phases of product development. These detailed tests can reveal design or process problems. By addressing these problems early during the development of a programmable logic device or other integrated circuit, the design of the device can be improved to reduce process sensitivity or the manufacturing process can be tuned to enhance manufacturing yields.

The configurable built in self test circuitry may be implemented by providing a block of hardwired built in self test circuitry on device 10. During testing, the hardwired built in self test circuitry may be used to test memory in device 10.

With another suitable approach, the configurable built in self test circuitry may be implemented using programmable logic resources on device 10. This type of built in self test circuitry, which is sometimes referred to as soft built in self test circuitry or a soft BIST, temporarily consumes programmable logic resources. After testing is complete, the programmable logic resources can be used to implement a desired logic design for a user (i.e., to implement user logic).

Soft BIST arrangements can be advantageous when it is desired to minimize the amount of hardwired circuitry on the device 10 that is dedicated to implementing BIST functions. Hardwired BIST arrangements can be advantageous in situations in which it is desirable to avoid the programming time associated with configuring a soft BIST. Memory test results can be analyzed on the programmable logic device that is being tested (e.g., using on-chip comparator circuitry), may be analyzed off chip, or may be analyzed both on-chip and off-chip.

Figure 2:
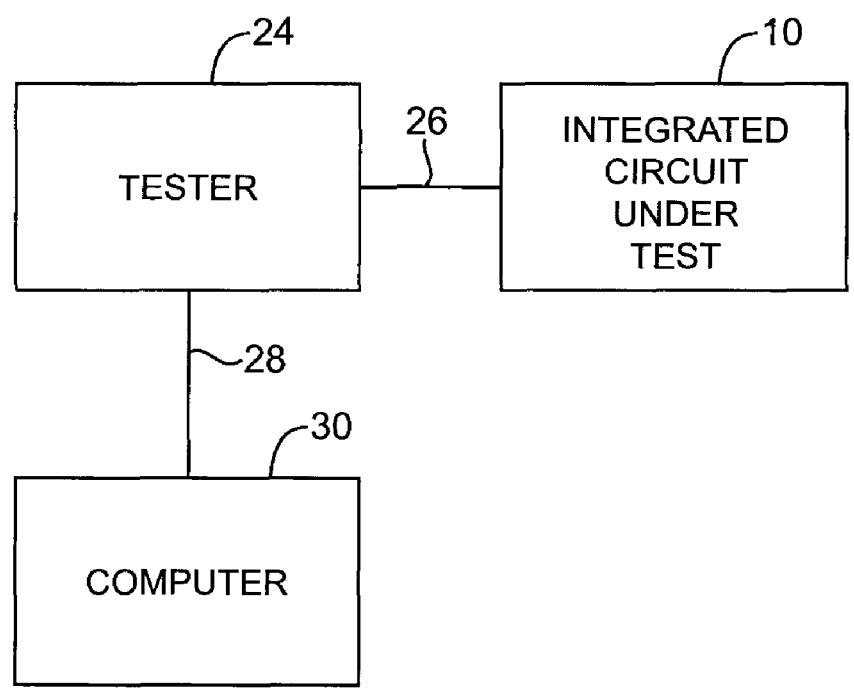
FIG. 2 is a diagram of an illustrative test environment in which programmable logic device integrated circuit memory tests are performed by configurable built in self test circuitry in accordance with an embodiment of the present invention.

A system environment of the type that may be used during test operations is shown in FIG. 2. A programmable logic device integrated circuit 10 or other integrated circuit under test may be connected to a tester 24 using test path 26. The device being tested, which is sometimes referred to as the device under test, may be an unpackaged integrated circuit such as a circuit in an undiced wafer or may be a packaged integrated circuit. Tester 24 may have an appropriate test fixture for making electrical connections with the pins 14 of device 10 during testing.

To perform a memory test, a user of the system of FIG. 2 defines a desired test to be performed by the built in self test circuitry by providing suitable test control data to computer 30. Testing software on computer 30 accepts this user input and provides corresponding test control data to tester 24 over path 28.

Tester 24 may apply power to device 10 through power pins. Based on the received test control data, tester 24 may provide suitable test control settings to built in self test circuitry on device 10 over path 26. Built in self test circuitry on device 10 has associated state machine logic and storage such as test control register circuitry. The test control settings may be loaded into the test control register circuitry. The operation of the state machine logic depends on the values of the test control settings that are loaded into the test control register circuitry. The state machine logic in the built in self test circuitry performs selected tests on the memory array based on the loaded test control settings.

As tests are performed, test data is generated on device 10. Device 10 may use internal circuitry to perform test analysis operations. For example, device 10 may be programmed to implement a comparator that compares expected test data to test data read from a memory array under test. By comparing the memory data that has been read from the memory array to the expected data, the comparator can determine which bits of the memory block are not performing properly. Test analysis may also be performed externally. For example, test data can be provided to computer 30 or other diagnostic tools via path 26, tester 24, and path 28. Tester 24 and computer 30 are typically implemented using personal computers, workstations, mainframes, or other computers loaded with testing software.

Tests are often run at speed. At-speed tests are performed at a normal clock speed or at a speed that is at least sufficient to ensure that the memory faults that are likely to be encountered during normal use are exercised. The minimum clock speed that is required to fully exercise memory array faults is sometimes referred to as a "functional" clock speed. With one suitable approach, testing is performed at the highest clock speed allowed when operating the memory normally in a system. Testing at the highest normal clock speed is sometimes preferred, because elevated speeds reveal faults that might not appear at slower clock speeds. The functional clock speed for a given device 10 depends on the capabilities of that device. As one example, the functional clock speed may be 400 MHz.

The test control settings that are loaded into the BIST test control register circuitry can be used to adjust a variety of test control parameters. As an example, the test control settings can be used to select a desired addressing scheme to be used in addressing the memory array during testing, may be used to select a desired background pattern for the background data stored in the memory array during testing, and may be used to select which test algorithm is used during testing. Examples of test algorithms that may be used include those in which multiple reads are performed on a memory cell, those in which a read is performed during a write, etc. Test control settings can also specify the order in which particular elements of a test are performed, the number of times an element of a test is performed, etc.

Figure 3:
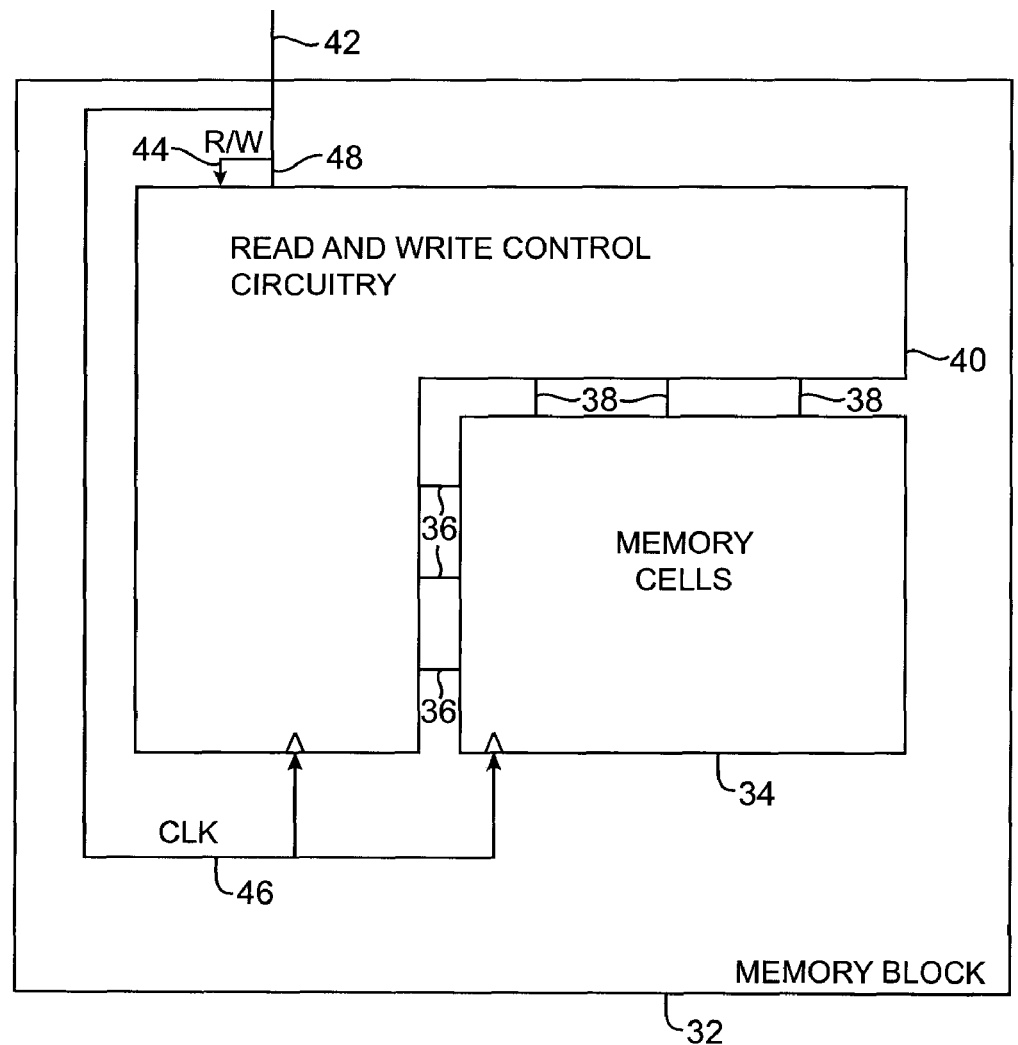
FIG. 3 is a diagram of a memory array that may be tested using configurable built in self test circuitry in accordance with an embodiment of the present invention.

An illustrative memory array 32 that may be tested using configurable built in self test circuitry is shown in FIG. 3. Memory array 32 includes a number of memory cells 34. Cells 34 may be, for example, an array of random-access memory cells arranged in rows and columns.

Horizontal conductors 36 and vertical conductors 38 and associated read and write control circuitry 40 may be used to load the memory cells 34 with test data and to read test data that has been loaded. By selection of appropriate horizontal and vertical lines, an individual cell 34 or a set of cells (e.g., a data word) can be written or read. In the illustrative configuration of FIG. 3, memory block 32 has a 3×3 array 34 of memory cells 34. Typical memory arrays typically have hundreds or thousands of rows and columns, but a 3×3 array is used as an example.

Read and write control circuitry 40 is used to control access to memory cells 34. During normal operation, path 42 carries a read/write control signal (R/W), a clock signal CLK, address signals, and data signals. Clock signal CLK is routed to path 46 and is used to clock data into and out of memory cell array 34. The value of read/write control signal R/W, which is routed to line 44, determines whether array 32 is in read mode or in write mode. Vertical lines 38, which receive address signals from path 42, may be used in addressing memory cells in array 34. When memory array 32 is in write mode, data is supplied to memory array 32 over paths 42 and 48 and lines 36 and is written into memory cells in array 34. When memory array 32 is in read mode, data from the memory cells of array 34 is conveyed to read and write control circuitry 40 over paths 36 and to external circuitry via path 48 and path 42.

Memory arrays such as memory array 32 can be addressed using various different address schemes. Consider, as an example, the illustrative four-cell memory array 32 of FIG. 4. The four cells in memory array 32 have been labeled 0, 1, 2, and 3. Each memory cell has a corresponding binary address. The address for cell 0 is 00, the address for cell 1 is 01, the address for cell 2 is 10, and the address for cell 3 is 11. The addresses each have a most significant (leftmost) and least significant (rightmost) bit. For example, in the address for cell 2, the most significant bit is 1 and the least significant bit is 0.

Figure 4:
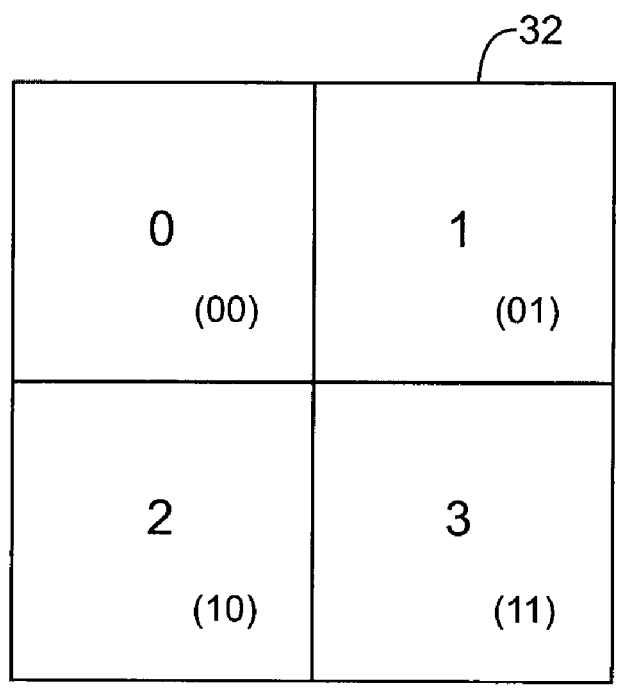
FIG. 4 is a diagram of an illustrative two by two memory array that may be tested using configurable built in self test circuitry in accordance with an embodiment of the present invention.

With one illustrative addressing scheme, read and write control circuitry 40 (FIG. 3) is used to increment the least significant address bit first, followed by increments to the most significant bit. With this type of addressing scheme, which is sometimes referred to as a fast-X addressing scheme, the cells of array 34 of FIG. 4 are addressed in the order 0, 1, 2, 3.

With another illustrative addressing scheme, read and write control circuitry 40 is used to increment the most significant bit first. The read and write control circuitry 40 then increments the least significant address bit. This type of addressing scheme is sometimes referred to as a fast-Y scheme. When a fast-Y addressing scheme is used to address memory 34, the cells of array 34 of FIG. 4 are addressed in the order 0, 2, 1, and 3.

Other addressing schemes may also be used to address array 34. For example, array 34 may be addressed using diagonal addressing schemes.

The addressing scheme that is used to address array 34 during testing can influence the test outcome. For example, a memory array 34 may pass a test performed using a fast-X addressing scheme, but may exhibit a fault when addressed using a fast-Y addressing scheme. It is therefore advantageous for a user who is testing an array 34 to be able to select a various different addressing schemes. This allows array 34 to be thoroughly tested.

Test results may also be affected by the background pattern of bits stored in array 34 during a test. Illustrative background patterns that may be used during testing are shown in FIGS. 5-10.

Figures 5, 6, 7, 8, 9, 10:
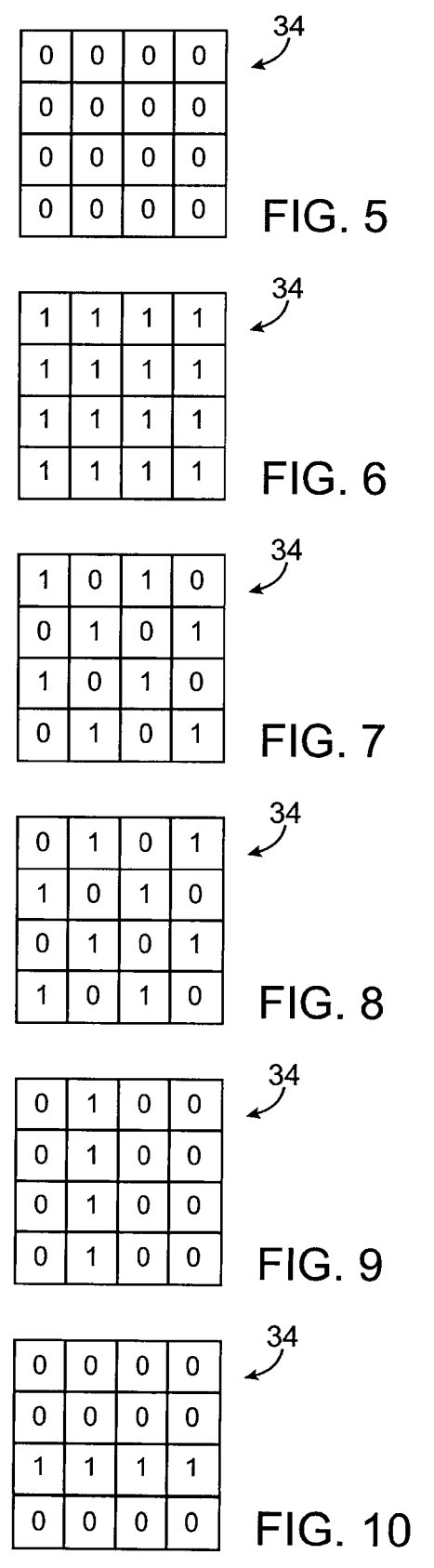

In FIG. 5, a background pattern of all zeros is used.

FIG. 6 uses a background pattern of all ones.

The background pattern of FIG. 7 is sometimes referred to as a checkerboard pattern, because it contains a pattern of alternating ones and zeros.

The background pattern of FIG. 8 is the inverse of the FIG. 7 checkerboard pattern and is therefore sometimes referred to as a not-checkerboard or ncheckerboard pattern.

A column stripe background pattern is shown in FIG. 9. In a column strip pattern, a column of array 34 is filled with ones in an array otherwise filled with zeros or a column of array 34 is filled with zeros in an array otherwise filled with ones. In the example of FIG. 9, the second of four columns of array 34 is filled with ones.

A row stripe background pattern contains a row of ones in an array otherwise filled with zero or a row of zeros in an array otherwise filled with ones. A row stripe background pattern example in which the third of four rows in array 34 has been filled with ones is shown in FIG. 10.

Altering the background pattern that is present in array 34 when a test is performed on array 34 can change the test results. For example, it may be possible to read and write data correctly from an array that is filled with zeros (the pattern of FIG. 5) but not from an array that is filled with ones (the pattern of FIG. 6). Thorough testing of array 34 may therefore involve performing tests with both the background pattern of FIG. 5 and the background pattern of FIG. 6.

Another factor that influences the outcome of a memory array test is the type of test algorithm that is used. For example, during a "multiple read" test, the value of a test data bit that has been stored in a particular cell in memory array 34 may be read out of the array multiple times (e.g., five times for a five-times multiple read test). As another example, it may be desirable to perform a read-after-write test in which data is read out of array 34 immediately after a write operation has been performed. Dual port memories have two active ports that may be in simultaneous operation. With this type of arrangement, read and write operations may occur simultaneously on both ports. In dual port memories, it may be desirable to test the memory by performing a read-during-write operation in which data is being read by one port while being written by the other port.

Memory arrays are often tested using test algorithms called march sequences. A march sequence is a series of test operations that are performed on a memory array to systematically test the operation of the array. March sequence tests are sometimes identified by the number of times each memory location is tested (the number of "march steps" in the test). For example, a test in which each memory location is visited ten times is sometimes called a "10N" test, whereas a test in which each memory location is visited twenty times is sometimes called a "20N" test. The results of tests performed at different march sequence test lengths (e.g., 10N versus 20N) may exhibit different results.

A typical test for a programmable logic device integrated circuit memory array such as memory array 34 might include five or six test algorithms with potentially different march sequence test lengths (e.g., 14N, 16N, 20N, etc.). To handle the complexity associated with performing a test that involves five or six test different algorithms, it might be possible to increase the amount of circuit real estate that is associated with a one-algorithm hardwired BIST circuit. For example, it might be possible to increase the size of the BIST circuitry by five or six times. Increasing the size of the BIST circuitry on a device in this way may not be acceptable, because too much circuit real estate may be consumed by the BIST logic. Soft BIST arrangements do not permanently consume circuit real estate. However, there is generally a considerable amount of programming time associated with forming soft BIST circuitry on a programmable logic device. It may therefore not be acceptable to repeatedly program and reprogram a soft BIST circuit to support different desired memory array test algorithms.

In accordance with the present invention, a number of different tests can be implemented using a single configurable built in self test circuit. The built in self test circuit may include configurable state machine logic. The operation of the state machine logic may be controlled by loading appropriate test control settings into a test control register. The test control register supplies control signals to the state machine and can be used to define the types of tests that the state machine will implement during memory array testing.

A march sequence is composed of a series of march elements. With one suitable arrangement, the test control settings include march element settings that allow a user to adjust which march elements are included in a march sequence.

The way in which a desired march sequence can be constructed from selected march elements may be understood with reference to an example. A well known march sequence is the so-called march LR sequence. The march LR sequence is defined by the following sequence of operations: $\updownarrow(w0)$; $\downarrow(r0,w1)$; $\uparrow(r1, w0, r0, w1)$; $\uparrow(r1, w0)$; $\uparrow(r0, w1, r1, w0)$; $\uparrow(r0)$. In this sequence, march elements are separated by semicolons. In a 10N test, each march element is repeated ten times, in a 20N test, each march element is repeated twenty times, etc. During testing (in this example), there are background patterns of all ones and all zeros.

Arrows in the march sequence are used to indicate the direction of testing and are referenced to a chosen addressing scheme. For example, if the chosen addressing scheme is a fast-X addressing scheme, an up arrow indicates that testing is to be performed in the fast-X direction (i.e., in the order 0, 1, 2, 3 in the example of FIG. 4) and a down arrow indicates that testing is to be performed in the opposite direction (i.e., in the order 3, 2, 1, 0). If the chosen addressing scheme is a fast-Y addressing scheme, an up arrow in a march element indicates that testing is to be performed in the fast-Y direction (i.e., in the order 0, 2, 1, 3 in the example of FIG. 4) and a down arrow indicates that testing is to be performed in the opposite direction (i.e., in the order 3, 1, 2, 0).

Symbols w0, r0, w1, and r1 represent memory cell operations. W0 and w1 are write operations. R0 and r1 are read operations. The notations 0 and 1 relate to the type of data that is being written or read. For example, the memory cell operation w0 specifies that the memory array should be filled with zeros and the memory cell operation w1 specifies that the memory array should be filled with ones. The memory cell operation r0 indicates that a memory cell should be read and tested to determine whether its contents is a zero. The memory cell operation r1 indicates that a memory cell should be read and tested to determined whether its contents is a one.

In the illustrative "march LR" march sequence, the first march element is $\uparrow(w0)$. Following this instruction, the configurable built in self test circuit will fill memory array 34 with zeros in either direction (up or down with respect to the chosen addressing scheme).

The second march element is $\downarrow(r0, w1)$. This march element indicates that, starting with the maximum address value for the memory array, each memory cell should be read and tested to determine whether it contains a logic zero (r0) and that a logic one should be written into the cell that has just been read (w1).

The third march element in the march LR sequence example is $\uparrow(r1, w0, r0, w1)$. According to this march element, testing should start at the minimum address location (i.e., address 0). Each cell of the array should be read and checked to determine whether it contains a logic one (r1). After this memory cell operation, a zero should be written (w0) and the cell should be read and checked to determine whether it contains a zero (r0). A whole array of ones should then be written into the array (w1).

The forth march element is $\uparrow(r1, w0)$. This element directs the configurable built in self test circuitry to increment the memory array address, starting at address 0. Each element of the array should be read and checked to determine whether it is a logic one, after which the entire array should be filled with zeros.

The fifth march element is $\uparrow(r0, w1, r1, w0)$. The arrow indicates that testing operations for this element should begin at address 0. Each memory cell in the memory array should be read and checked to determine whether it is a logic zero, after which the entire array should be filled with ones. Each memory cell in the memory array should then be read and checked to determine whether it is a logic one, after which the entire array should be filled with zeros.

The sixth and last march element is $\uparrow(r0)$. Starting at the low end of the address range, each memory cell should be read and checked to determine whether it is a logic zero.

Figure 11:
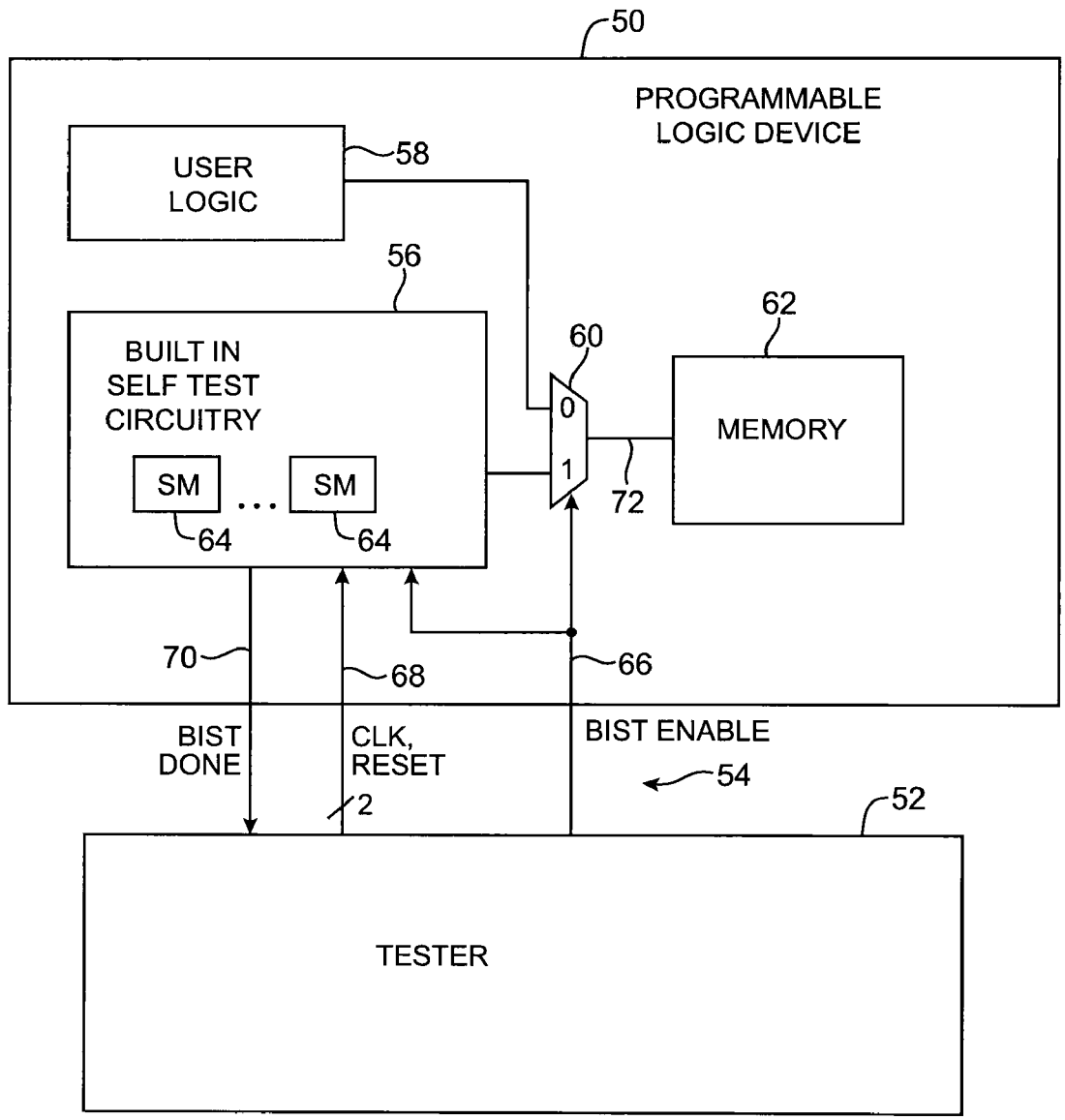
FIG. 11 is a diagram of a programmable logic device with conventional build in self test circuitry.

In conventional built in self test arrangements, a hardwired state machine is used to implement march sequences such as the march LR march sequence. Additional state machines are used to implement additional march sequences. A conventional built in self test configuration is shown in FIG. 11. Tester 52 is connected to programmable logic device 50 over paths 54. Programmable logic device 50 includes built in self test circuitry 56. Built in self test circuitry 56 includes multiple state machines 64, each of which is used to implement a corresponding march sequence for testing memory array 62. During normal operation of device 50, line 66 is pulled low and multiplexer 60 connects user logic 58 to memory 62. During testing, tester 52 asserts the signal BIST ENABLE, which directs multiplexer 60 to connect built in self test circuitry 56 to memory 62.

During a typical test, tester 52 clears built in self test circuitry 56 by asserting the reset signal RESET on path 68. Tester 52 also asserts the BIST ENABLE signal on path 66 to adjust multiplexer 60 and to direct built in self test circuitry to begin testing. While running clock signal CLK on path 68, the state machines 64 in built in self test circuitry 56 are used in sequence to apply test signals to memory 62 over path 72. When testing is complete, built in self test circuitry 56 asserts the signal BIST DONE on path 70 to notify tester 52. Dual port operations may be performed using a conventional dual port version of the built in self test circuitry of FIG. 11.

During testing, the tests that are implemented in state machines 64 are run in sequence. Because the state machines 64 of FIG. 11 are fixed, built in self test circuitry 56 cannot be configured. With this type of arrangement, a relatively large area of hardwired circuitry must be used to implement state machines 64.

Figure 12:
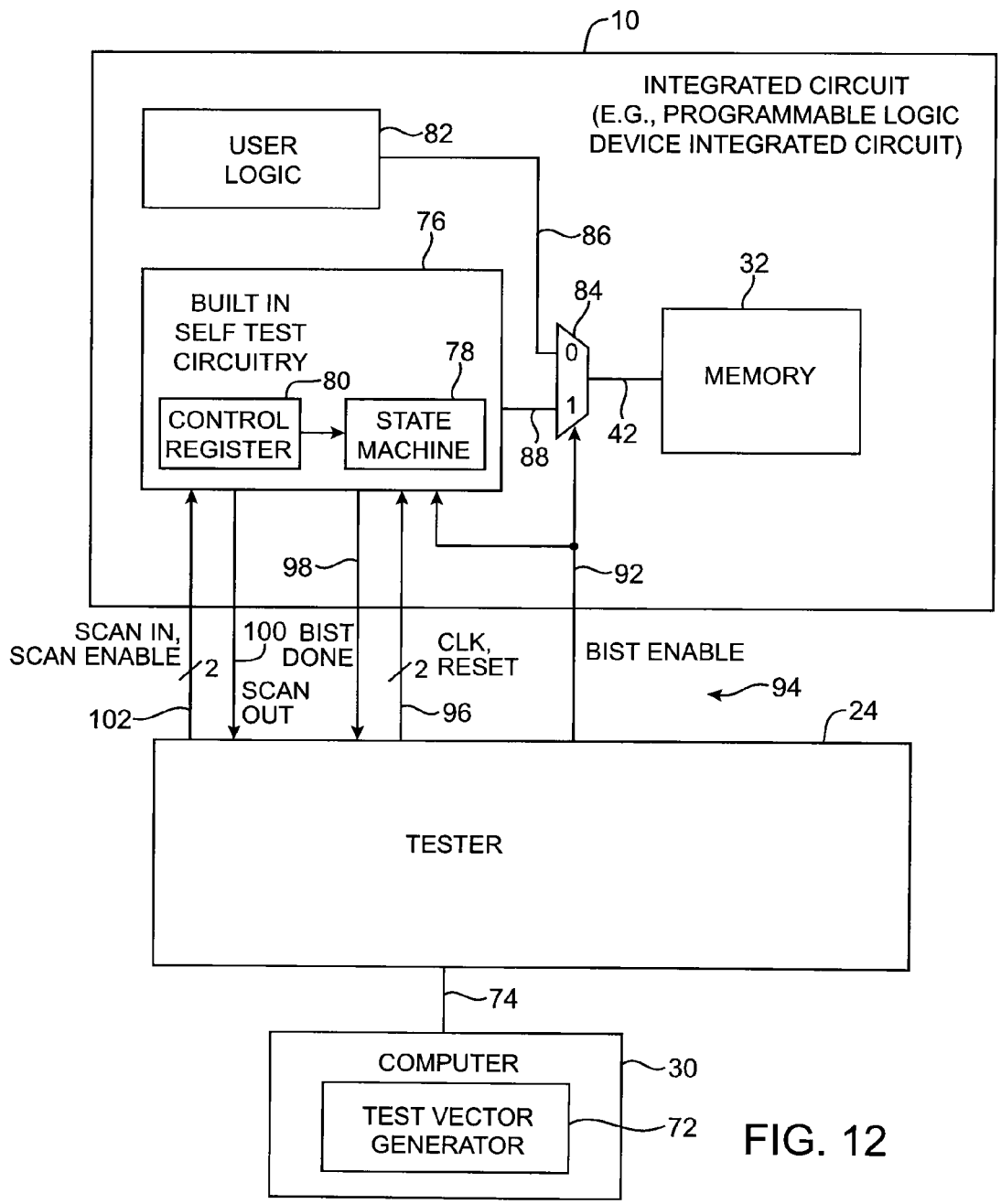
FIG. 12 is a diagram of an illustrative integrated circuit such as a programmable logic device having configurable built in self test circuitry in accordance with an embodiment of the present invention.

A system with configurable built in self test circuitry in accordance with the present invention is shown in FIG. 12. Computer 30 may communicate with tester 24 over path 74. Computer 30 may be a personal computer, a workstation, other suitable computing equipment, or a network of such equipment. Tester 24 may also be based on a personal computer, a workstation, other suitable computing equipment, or a network of such equipment. Path 74 may be a wired or wireless local area network path, a wide area network path (e.g., an internet path) or any other suitable communications path.

During setup operations, a user (e.g., one or more individuals who are responsible for testing integrated circuit 10) may supply computer 30 with information that defines what type of memory tests are desired. For example, a user may click on on-screen options or type entries into computer 30 that define a series of march elements for one or more desired march sequences. Computer 30 may have a test vector generator 72 for generating test control data based on the user's input. The test control data may be supplied to tester 24 via path 74. Tester 24 may provide the raw test control data from computer 30 or new test control data that is derived from the raw test control data to built in self test circuitry 76 on integrated circuit 10. The test control data instructs built in self test circuitry 76 how to test memory 32.

Integrated circuit 10 may be a programmable logic device integrated circuit or any other suitable circuit that contains memory to be tested such as memory array 32. Arrangements in which integrated circuit 10 is a programmable logic device integrated circuit are sometimes described herein as an example.

In normal operation of a programmable logic device, a logic designer (user) may program some of the programmable logic on the device to perform a desired logic function. This logic, which is shown schematically as user logic 82 in FIG. 12, may access memory 32. Multiplexer circuitry 84 is responsive to the signal BIST ENABLE on path 92. When BIST ENABLE is deasserted, multiplexer circuitry 84 connects path 86 to path 42. In this configuration, user logic 82 can be used in normal operation to communicate with memory array 32.

During testing, the signal BIST ENABLE is asserted by tester 24. This directs multiplexer circuitry 84 to connect path 88 to path 42. When paths 88 and 42 are connected to each other, built in self test circuitry 76 communicates with memory array 32. Test signals that may be conveyed over paths 88 and 42 during testing include read/write enable signal R/W, clock signal CLK, address signals, and data signals, as described in connection with memory array 32 of FIG. 3.

Built in self test circuitry 76 is configurable. This allows built in self test circuitry 76 to perform multiple tests on memory array 32. For example, built in self test circuitry 76 can perform tests using multiple march sequences. Built in self test circuitry 76 can perform these multiple march sequence tests without using multiple state machines of the type used in conventional built in self test circuitry 56 of FIG. 11.

Built in self test circuitry 76 has configurable state machine logic such as state machine 78 and has test control register circuitry such as test control register 80. During testing, tester 24 loads test control settings into test control register 80. The test control settings, which are based on the user-supplied test control data from computer 30, define tests that are to be performed on memory array 32. For example, the test control settings may include march element settings that specify which at-speed march sequence tests are to be performed on memory array 32.

Tester 24 communicates with integrated circuit 10 via communications paths 94. Built in self test memory tests are enabled by asserting signal BIST ENABLE on path 92. A clock signal CLK and reset signal RESET are applied to built in self test circuitry 76 via path 96. Built in self test circuitry 76 may supply a signal BIST DONE to tester 24 using path 98. Built in self test circuitry 76 may supply test results tester 24 via SCAN OUT path 100. Signals SCAN IN and SCAN ENABLE are provided by tester 24 to built in self test circuitry 76 via path 102.

Figure 13:
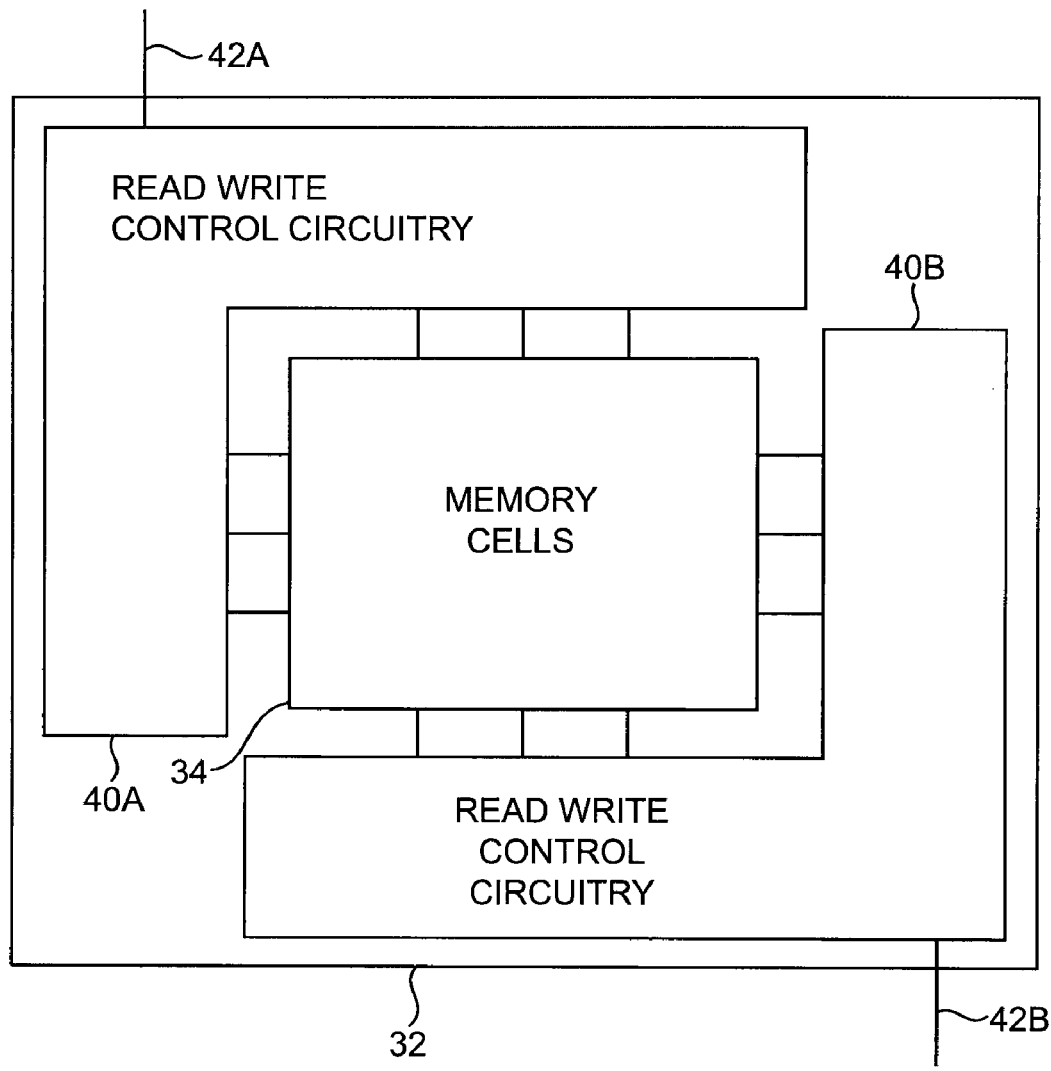
FIG. 13 is a diagram of an illustrative dual port memory array that may be tested using configurable built in self test circuitry in accordance with an embodiment of the present invention.

If desired, built in self test circuitry 76 may be used to test a dual port memory array such as dual port memory array 32 of FIG. 13. Memory array 32 of FIG. 13 has two signal paths 42A and 42B in place of the single signal path 42 in the single port memory array 32 of FIG. 3 and has two corresponding read and write control circuits 40A and 40B in place of the single block of read and write control circuitry 40 in FIG. 3. This allows dual port memory array 32 to support simultaneous read and write operations on two different ports. For example, data may be written into cells 34 or read from cells 34 using a first port formed using path 42A and read and write control circuitry 40A, while data is simultaneously written or read through a second port formed using path 42B and read and write control circuitry 40B.

Figure 14:
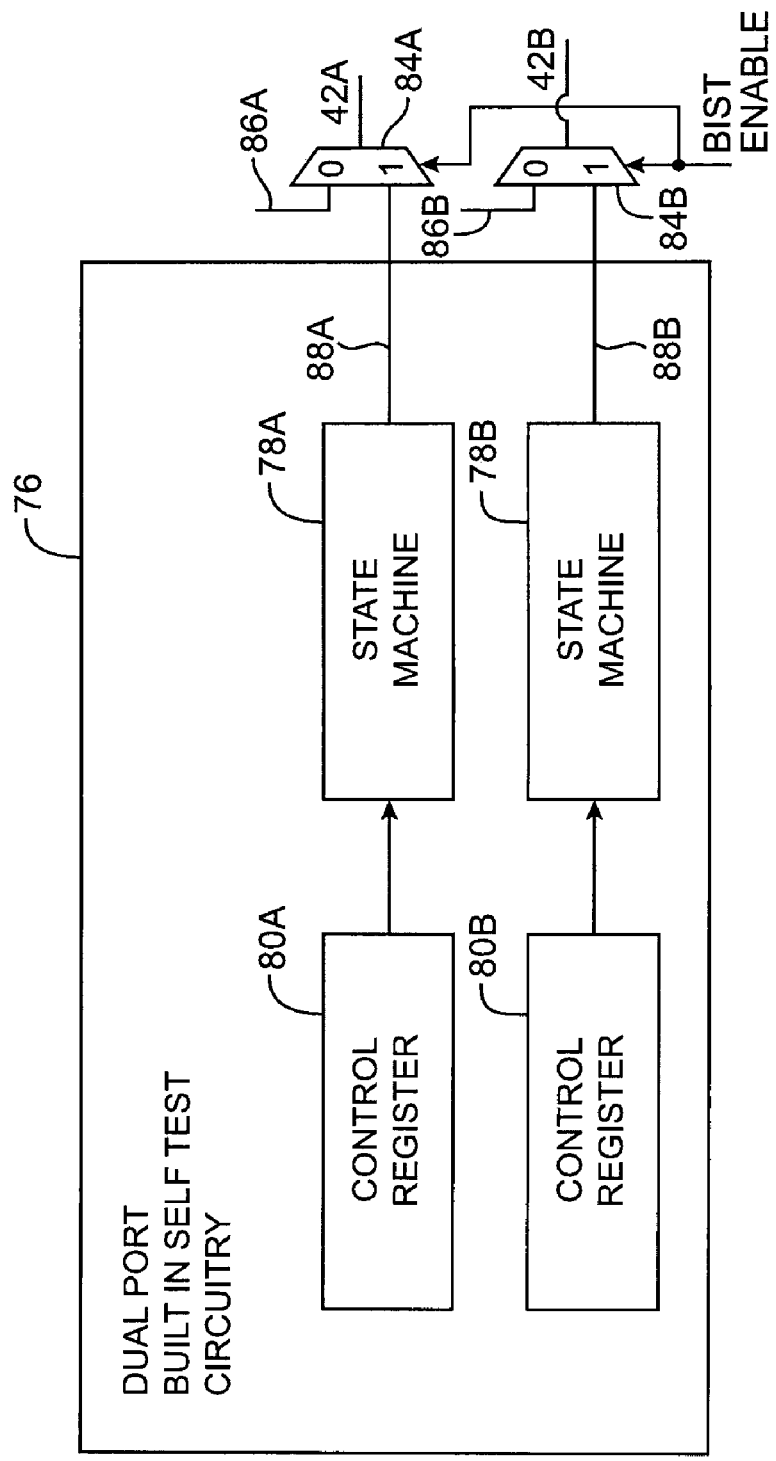
FIG. 14 a diagram of illustrative configurable built in self test circuitry that may be used in testing a dual port memory array of the type shown in FIG. 13 in accordance with an embodiment of the present invention.

Illustrative dual port built in self test circuitry 76 that may be used to test dual port memory array 32 of FIG. 13 is shown in FIG. 14. As shown in FIG. 14, dual port built in self test circuitry 76 may have first and second control registers 80A and 80B and first and second corresponding state machines 78A and 78B. Test control signals (e.g., march element settings) may be loaded into control register circuitry 80A and 80B to define which test are performed on memory array 32 of FIG. 13. State machine logic 78A and 78B generates test signals such as read/write control signals, clock signals, address signals, and data signals for testing memory array 32. State machine 78A generates test signals based on the test control signals that have been loaded into control register 80A. State machine 78B generates test signals based on the test control signals that are loaded into control register 80B.

Multiplexer circuitry 84A and 84B is used to selectively connect state machine paths 88A and 88B to memory array paths 42A and 42B. When signal BIST ENABLE is deasserted, multiplexer circuitry 84A and 84B connects user logic paths 86A and 86B to paths 42A and 42B, respectively. This allows user logic to access dual port memory array 32 of FIG. 13 during normal operation of device 10. When signal BIST ENABLE is asserted, multiplexer circuitry 84A and 84B connects state machine paths 88A and 88B to paths 42A and 42B, respectively. In this mode, dual port memory array 32 of FIG. 13 can be tested using the dual port built in self test circuitry 76 of FIG. 14.

Figure 15:
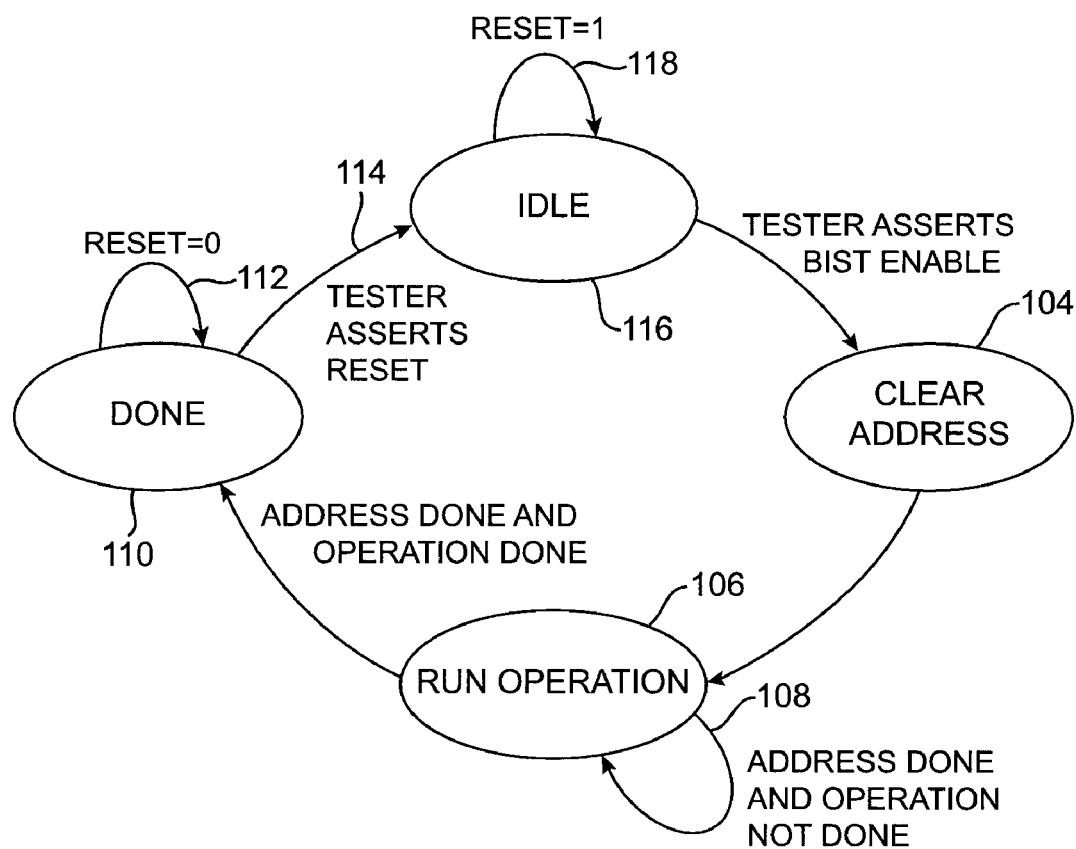
FIG. 15 is a diagram of an illustrative state machine that may be implemented in configurable built in self test circuitry in accordance with an embodiment of the present invention.

A diagram showing the operation of the built in self test circuitry's state machine logic such as state machine 78 of FIG. 12 is shown in FIG. 15. State machine 78 may have an address generator for generating address signals and a test data pattern generator that generates test data signals for the memory array. The operations of the address generator and test data pattern generator are responsive to the state of the test control signals loaded into control register circuitry 80.

In clear address state 104, the state machine's address generator is set to an appropriate initial value. For example, when a march element involves an up direction (↑), the initial address value may be set to zero. When a march element involves a down direction (↓), the initial address value may be set to a maximum valid address value.

After the address has been set to an appropriate initial value, the state machine enters run operation state 106. As indicated by arrow 108, the state machine remains in state 106 running all steps in the current march element until all address values have been covered and all test operations have been completed.

Testing is complete for all addresses in memory array 34 when the state machine has reached the maximum address after having started at a zero address value, when the state machine has reached a zero address value after having started at a maximum address value, or when the state machine has otherwise finished addressing all of the cells in memory array 32 and after all test operations at the last address value have been finished. The state machine then transitions to state 110.

In state 110, the state machine asserts the BIST DONE signal on path 98 (FIG. 12) and, as indicated by arrow 112, sets signal RESET to zero. In state 110, the state machine awaits assertion of the signal SCAN ENABLE by tester 24. When the tester is ready to load the test control settings for another test, the tester asserts the signal RESET (line 114) and asserts SCAN ENABLE.

In state 116, tester 24 is loading control register 80 via SCAN IN line 102. The signal SCAN ENABLE is high and, as indicated by line 118, signal RESET is high. State machine 78 awaits completion of loading. After loading of control register 80 is complete, tester 24 asserts the signal BIST ENABLE, as shown by line 120. When BIST ENABLE is asserted, state machine 78 transitions to state 104, where the address set to its initial value. Testing is then performed in state 106. This process continues until all desired tests have been completed.

Because different test control signals can be loaded into control register 80, state machine 78 can be reconfigured as needed to perform a variety of different memory array tests. For example, configurable state machine 78 of FIG. 15 can be directed to use five separate march sequences to test memory array 32. These tests may be performed without needing to implement five separate fixed state machines 64 of the type described in connection with FIG. 11.

Figure 16:
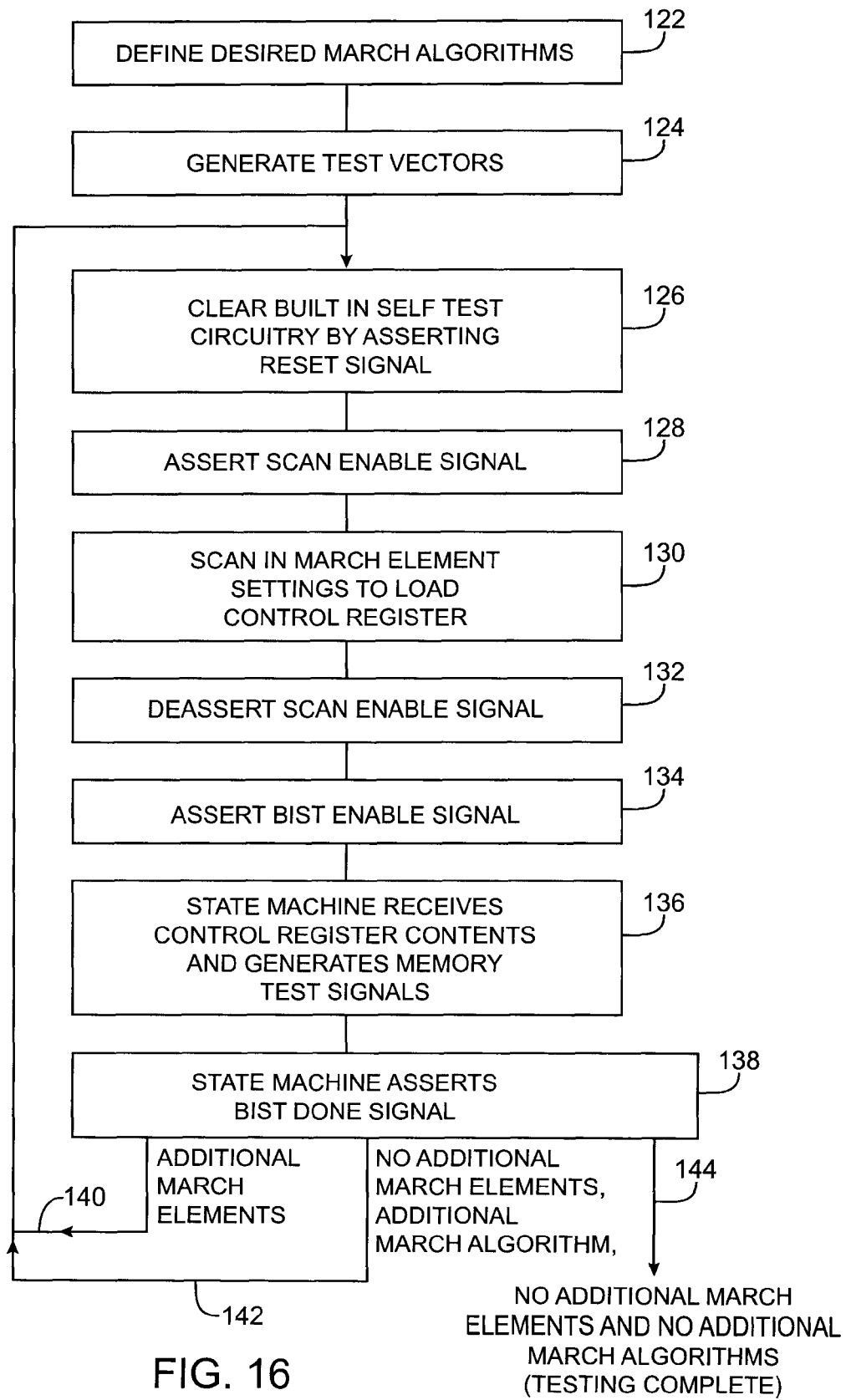
FIG. 16 is a flow chart of illustrative steps involved in performing memory tests on a memory array using configurable built in test circuitry in accordance with an embodiment of the present invention.

A flow chart of illustrative steps involved in using a system of the type shown in FIG. 12 to test memory arrays such as memory array 32 are shown in FIG. 16. Integrated circuit 10 may contain multiple memory arrays 32, but testing of a single memory array 32 is described as an example.

At step 122, a user defines desired march sequences to be used in testing memory array 32. Any suitable arrangement may be used to allow the user to specify which march algorithms or other memory array test algorithms are to be used during testing. With one suitable arrangement, computer 30 presents the user with a series of clickable on-screen options.

The user can click on desired options to select from a set of predefined march sequences. For example, a drop-down menu or other suitable user interface may be provided that includes options such as "march LR"—indicating that the march LR march sequence is desired. The user may also be provided an opportunity to design customized march sequences. The user may, for example, type in a series of march elements separated by semicolons. A typical march element defined by the user in this way might be ↑(r1, w0, r0, w1). Each march element may include a march address direction (e.g., up as indicated by an up arrow) and one or more memory cell operations (e.g., r1). A user may also specify how many times each memory location in the memory array is to be tested (the number of "march steps" in the test).

After the user has supplied computer 30 with information on which march sequences are to be used during testing, test vector generator 72 (FIG. 12) generates corresponding test control data (sometimes referred to as test vectors). The test data includes march element settings or other suitable test control settings for loading into control register circuitry 80.

At step 126, tester 24 clears built in self test circuitry 76 by asserting signal RESET on path 96.

At step 128, tester 24 asserts scan enable signal SCAN ENABLE on path 102.

At step 130, tester 24 uses SCAN IN path 102 to provide the march element settings to control register circuitry 80. The clock signal CLK is used while loading the control register. Any suitable arrangement may be used when providing in the march element settings to built in self test circuitry 76. With one suitable approach, march element settings for a particular march element are loaded.

After the march element settings have been loaded into the control register 80, tester 24 deasserts the SCAN ENABLE signal (step 132).

At step 134, tester 24 asserts the BIST ENABLE signal. The BIST ENABLE signal is applied to the control input of multiplexer circuitry 84 (FIG. 12) and directs multiplexer circuitry 84 to connect path 88 to path 42. The BIST ENABLE signal is also applied to built in self test circuitry 76.

At step 136, built in self test circuitry 76 receives the BIST ENABLE signal. In response, state machine 78 uses the march element settings that have been loaded into control register 80 to generate corresponding memory test signals. A read-write enable signal R/W, a clock signal CLK, address signals, and data signals that are generated by state machine 78 are provided to memory array 32 using paths 88 and 42.

State machine 78 performs all steps in the currently defined march element. When testing using the march element is complete, state machine 78 asserts the BIST DONE signal. If the current march sequence contains additional march elements, control may loop back to step 126, as indicated by line 140. Control may also loop back to step 126 if there are no additional march elements in the current sequence to be processed, but there is an additional march sequence to be processed, as indicated by line 142. When all march sequences have been completed, testing is finished (line 144). Test results may be scanned out of integrated circuit 10 and built in self test circuitry using SCAN OUT path 100. Tester 24 may analyze the test results and/or may provide the test results to external equipment such as computer 30 for analysis.

Any suitable format may be used for the march element settings. With one illustrative arrangement, control register 80 stores about 50-100 bits of march element settings data. The status of each bit may be used to control a different aspect of the behavior of state machine 78.

One march element settings bit may be used for testing dual port memory arrays. If the value of this bit is high, state machine 78 will perform a read during write operation and will compare the read data to expected data values. If this march element settings bit is low, state machine 78 will not perform a comparison of read data to expected data, allowing undisturbed writing operations. As an example, if the current address is 357 and the march element settings bit is low, a "w0" memory cell operation in a march element will result in writing a zero to address 357 without performing a read operation, whereas if the march element settings bit is high, the "w0" memory cell operation will result in writing a zero to address 357 and simultaneously reading from address 357 and comparing the read value to the expected value for address 357.

Some march element settings bits may be used to define which memory cell operation is to be performed by state machine 78. The defined memory cell operations may include operations r0, r1, w0, and w1, as described in connection with the march LR march sequence example. If desired, memory cell operations may be grouped together, so that the available options include (for example), r0, r1, w0r0, w1r1, wor1, w1r0. This approach may be used to reduce the number of march element settings bits that are required to cover all desired memory cell operations. An optional "NO_OP" memory cell operation may be defined to handle situations in which no comparison is to be made between read data values and expected data values.

March element settings bits may be used to define the number of memory cell operations in a given march element. These bits specify how many operations are to be performed at a particular memory array address and take the place of semicolons in a typical symbolic march sequence representation. If four march element settings bits are allocated for this march element setting, up to sixteen memory cell operations may be performed per march element. In schemes in which more than four march element settings bits are allocated to specify how many operations are to be performed at a particular memory array address, more than 16 memory cell operations may be performed per march element.

March element settings bits may be used to specify which background pattern of test bits is to be stored in the memory array. With one suitable arrangement, two march element settings bits are used for this setting. If the march element settings bits are 00, a solid background will be used as described in connection with FIGS. 5 and 6. When a solid background pattern is selected, a "w0" memory cell operation will cause state machine 78 to write all zeros into array 32. If the march element settings bits are 01, a checkerboard pattern may be used as described in connection with FIGS. 7 and 8. When a checkerboard pattern is used, a "w0" memory cell operation will cause a checkerboard pattern to be written and a "w1" memory cell operation will cause an ncheckerboard pattern to be written. If the march element settings bits are set to 10, a row stripe background pattern may be used, as described in connection with FIG. 10. If the two memory element settings bits are 11, a column stripe pattern may be used, as described in connection with FIG. 10.

Other march element settings bits may be used to define an offset between the ports that are being tested in a dual port memory. These march element settings bits define the address of a secondary port relative to the address of the currently tested port. With one illustrative arrangement, two march element settings bits are used to define the relative positions of the ports in a dual port memory. The row and column positions of the current port may be defined as r and c, respectively. If the settings bits have a value of 00, the row and column positions for the secondary port may be r−1 and c. If the settings bits have a value of 01, the row and column positions of the secondary port may be r and c−1. If the settings bits have a value of 10, the row and column positions for the secondary port may be r+1 and c. If the settings bits have a value of 11, the row and column positions of the secondary port may be r and c+1. In this example, the positions of the primary and secondary ports are never more than one position apart. If desired, greater separations between the primary port and secondary port addresses may be defined. A larger number of march element settings bits may be used to define these offsets.

In state machine logic of the type shown in FIG. 14, there may be two state machines, one of which is associated with each of the two ports in a dual port memory array. In this type of configuration, a march element settings bit may be used to identify which state machine is running on the primary port and which state machine is running on the secondary port.

If desired, march element settings bits may be used to define a linear march address direction to be used by the state machine (e.g., up by incrementing the address or down by decrementing the address). March element settings bits may also be used to define nonlinear march address directions such as diagonal, fast-X, and fast-Y, etc.

These examples are not exhaustive. Additional march element settings bits may be used to define additional march sequence test settings if desired.

Figure 17:
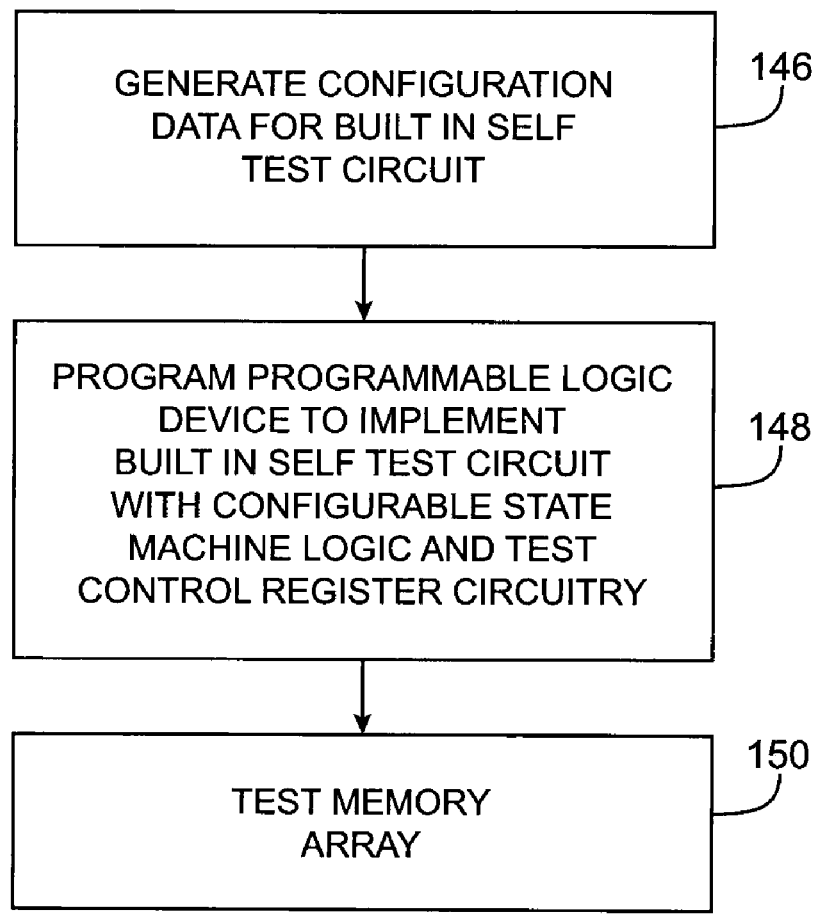
FIG. 17 is a flow chart of illustrative steps involved in using configurable built in self test circuitry that is formed from programmable logic to test memory arrays in accordance with an embodiment of the present invention.

The built in self test circuitry of FIG. 12 may be implemented using hardwired circuitry or using programmable logic (e.g., programmable resources on a programmable logic device integrated circuit or other programmable integrated circuit). Illustrative steps involved in performing memory tests using a soft BIST arrangement are shown in FIG. 17.

A step 146, a computer aided design (CAD) system is used to design state machine logic 78. The CAD system may be implemented using computer equipment such as computer 30 of FIG. 12. The CAD system converts the design into configuration data for a desired programmable logic device integrated circuit or other programmable integrated circuit. The configuration data may be provided to tester 24 or other suitable equipment or circuitry capable of loading the configuration data into a programmable integrated circuit 10. When the configuration data is loaded into the programmable elements 20 on the integrated circuit, the programmable elements produce static control signals that turn on and off associated transistors in the programmable logic. This configures the programmable logic so that the programmable logic performs the functions of the built in self test circuitry 76 including the configurable state machine 78 and the control register 80 of FIG. 12.

At step 150, after the built in self test circuitry 76 has been implemented using the programmable logic on the integrated circuit (e.g., using electrically-programmed or mask-programmed programmable logic 18 of programmable logic device 10 of FIG. 1), tester 24 and built in self test circuitry 76 of FIG. 12 may be used to test memory array 32 as described in connection with FIG. 16 (step 150).

The foregoing is merely illustrative of the principles of this invention and various modifications can be made by those skilled in the art without departing from the scope and spirit of the invention.

What is claimed is:

1. A method of testing a memory array on an integrated circuit with built in self test circuitry that includes test control register circuitry and configurable state machine logic, the method comprising:

loading memory test control settings into the test control register circuitry; and with the configurable state machine logic, performing memory tests on the memory array based on the loaded memory test control settings, wherein the memory test control settings include march element settings for a march sequence, wherein performing the memory tests comprises performing tests on the memory array with the configurable state machine logic using the march sequence, and wherein the march element settings include march element settings that specify how the configurable state machine logic is to perform a read-during-write memory cell operation when performing the tests on the memory array.

2. The method defined in claim 1 wherein the march element settings include march element settings that define a march address direction for the configurable state machine logic to use in performing the tests on the memory array.

3. The method defined in claim 1 wherein the march element settings include march element settings that define a memory array background data pattern for the configurable state machine logic to use in performing the tests on the memory array.

4. The method defined in claim 1 wherein the march element settings include march element settings that define the number of memory cell operations in each of the march elements.

5. The method defined in claim 1 wherein the march element settings include march element settings that define a march address direction for the configurable state machine logic to use in performing the tests on the memory array, and wherein the march element settings include march element settings that define a memory array background data pattern for the configurable state machine logic to use in performing the tests on the memory array.

6. The method defined in claim 1, wherein the march element settings include march element settings that define an addressing scheme for the configurable state machine logic to use in performing the tests on the memory array, and wherein the addressing scheme includes at least one of a fast-X addressing scheme and a fast-Y addressing scheme.

7. The method defined in claim 1 wherein the integrated circuit comprises a programmable integrated circuit, the method further comprising loading configuration data into programmable elements on the programmable integrated circuit to configure programmable logic on the programmable integrated circuit to implement the configurable state machine logic.

8. The method defined in claim 1 wherein the memory test control settings include march element settings that define a march LR sequence, wherein performing the memory tests comprises using the march LR sequence to perform the memory tests.

9. The method defined in claim 1 wherein performing the memory tests comprises performing at-speed memory tests at a normal clock speed.

10. The method defined in claim 1 wherein the memory array comprises a dual port memory array and wherein performing the memory tests comprises performing the memory tests on the dual port memory array.

11. The method defined in claim 1 wherein the march element settings include march element settings that define an addressing scheme for the configurable state machine logic to use in performing the memory tests on the memory array, wherein the addressing scheme includes at least one of a fast-X addressing scheme and a fast-Y addressing scheme, and wherein the march element settings define a data background pattern for the memory array that is selected from the group consisting of: a solid background, a checkerboard background, a row striped background, and a column striped background.

12. A programmable logic device integrated circuit comprising:
    programmable logic;
    at least one memory array; and
    a built in self test circuit that tests the memory array, wherein the built in self test circuit comprises test control register circuitry and configurable state machine logic, wherein march element settings for a memory test are loaded into the test control register circuitry, wherein the configurable state machine logic receives the march element settings from the test control register circuitry and tests the memory array based on the march element settings, and wherein the march element settings include march element settings that specify how the configurable state machine logic is to perform a read-during-write memory cell operation when performing the tests on the memory array.

13. The programmable logic device integrated circuit defined in claim 12 wherein the built in self test circuit is at least partly implemented in the programmable logic.

14. The programmable logic device integrated circuit defined in claim 12 further comprising multiplexer circuitry that selectively connects the configurable state machine logic to the memory array, wherein the multiplexer circuitry receives a control signal from a tester.

15. The programmable logic device integrated circuit defined in claim 12 wherein the memory array comprises a dual port memory array having first and second ports and wherein the configurable state machine logic comprises a first configurable state machine that produces test signals for a first port based on the march element settings and second configurable state machine that produces test signals for the second port based on the march element settings.

16. Built in self test circuitry for testing a memory array on an integrated circuit comprising:
    test control register circuitry that is loaded with march element settings; and
    configurable state machine logic that applies test signals to the memory array in a march sequence based on the march element settings loaded into the test control register circuitry, wherein the march element settings include march element settings that specify how the configurable state machine logic is to perform a read-during-write memory cell operation when performing tests on the memory array.

17. The built in self test circuitry defined in claim 16 further comprising a scan input and a scan enable input, wherein the march element settings are loaded into the test control register circuitry over the scan input when a scan enable signal is asserted on the scan enable input.

18. The built in self test circuitry defined in claim 16, wherein the built in self test circuitry is part of a programmable logic device integrated circuit comprising programmable logic and wherein the built in self test circuitry further comprises circuitry formed from the programmable logic.

* * * * *